(12) United States Patent
Hidaka et al.

(10) Patent No.: US 11,761,906 B2
(45) Date of Patent: Sep. 19, 2023

(54) OPTICAL DEVICE

(71) Applicant: Samsung Electronics Co., Ltd., Suwon-si (KR)

(72) Inventors: Yasuhiro Hidaka, Yokohama (JP); Mitsunori Numata, Yokohama (JP)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 35 days.

(21) Appl. No.: 17/570,763

(22) Filed: Jan. 7, 2022

(65) Prior Publication Data

US 2022/0214288 A1   Jul. 7, 2022

(30) Foreign Application Priority Data

Jan. 7, 2021 (JP) .................................. 2021-001199
Oct. 22, 2021 (KR) ......................... 10-2021-0141900

(51) Int. Cl.
  *G01N 21/95* (2006.01)
  *G01B 11/24* (2006.01)
  *G01N 21/88* (2006.01)

(52) U.S. Cl.
  CPC ......... *G01N 21/9501* (2013.01); *G01B 11/24* (2013.01); *G01N 21/8806* (2013.01); *G01N 21/8851* (2013.01)

(58) Field of Classification Search
  CPC ........... G01N 21/9501; G01N 21/8806; G01N 21/8851; G01N 21/956; G01B 11/24; G03F 7/70616; G03F 7/70625; G03F 7/70633
  See application file for complete search history.

(56) References Cited

U.S. PATENT DOCUMENTS

| | | | |
|---|---|---|---|
| 6,480,285 B1 | 11/2002 | Hill | |
| 8,054,467 B2 | 11/2011 | Boef et al. | |
| 2009/0123879 A1* | 5/2009 | Hidaka | G03F 9/7026 430/325 |
| 2018/0067057 A1* | 3/2018 | Shmarev | G01N 21/21 |
| 2019/0302025 A1* | 10/2019 | Jung | G01N 21/8806 |
| 2022/0291140 A1* | 9/2022 | Honda | G01N 21/9501 |

FOREIGN PATENT DOCUMENTS

| | | |
|---|---|---|
| JP | H06-177218 A | 6/1994 |
| JP | H11-295232 A | 10/1999 |
| JP | 3219462 B2 | 10/2001 |
| JP | 4778147 B2 | 9/2011 |

* cited by examiner

*Primary Examiner* — Tarifur R Chowdhury
*Assistant Examiner* — Carlos Perez-Guzman
(74) *Attorney, Agent, or Firm* — Muir Patent Law, PLLC

(57) ABSTRACT

An optical device is provided. The optical device includes: a light source; a pinhole plate arranged on a path of input light between the light source and an objective lens; an image sensor configured to detect a reflected light generated by the input light being reflected by a sample; and a noise filter arranged on the path of the reflected light between the image sensor and the objective lens, and the noise filter may remove a part of the reflected light generated by underlying layers below a measurement target layer of the sample.

16 Claims, 13 Drawing Sheets

OPTICAL DEVICE

CROSS-REFERENCE TO RELATED APPLICATIONS

This application is based on and claims priority under 35 U.S.C. § 119 to Japan Patent Application No. 2021-001199, filed on Jan. 7, 2021, in the Japan Intellectual Property Office, and Korean Patent Application No. 10-2021-0141900, filed on Oct. 22, 2021, in the Korean Intellectual Property Office, the disclosures of which are incorporated by reference herein in their entirety.

BACKGROUND

The inventive concept relates to an optical device, for example, an optical device for measuring a shape error of a three-dimensional structure formed on a wafer in a semiconductor device manufacturing process.

In a semiconductor device manufacturing process, it is necessary to measure the shape of a three-dimensional structure formed on a wafer, which affects device performance. Since dimensions of patterns of semiconductor devices to be measured are smaller than the resolution of a conventional optical microscope, it may be difficult to measure shapes of patterns using an optical microscope. Therefore, to directly measure the shapes of the patterns of semiconductor devices, a method with higher resolution, such as an electron microscope, is required, but electron microscopes have a problem in that the measurement time is too long.

An indirect optical measurement device including scatterometry has become indispensable for mass production of semiconductor devices in terms of measurement speed. In this case, the indirect optical measurement device may obtain an average shape of an illumination area by using a response such as reflectance without directly resolving the shape of the object to be observed.

On the other hand, along with the miniaturization of patterns of the devices, the required measurement accuracy is further increased, and it is necessary to detect lowered error signals with a good sensitivity.

In U.S. Pat. No. 8,054,467, by placing the detector on the conjugate pupil plane (i.e., Fourier transform plane) of the objective lens, not on the pattern of the device formed on the wafer as in a conventional optical microscope, methods of detecting a diffraction pattern appearing on the pupil plane or a change in the intensity of distribution within the pupil plane and performing high-sensitivity critical dimension (CD) measurement, pattern overlay measurement, or the like have been proposed.

SUMMARY

A semiconductor device is constructed by stacking various patterns by hundreds of manufacturing processes. The device pattern dimensions have been refined not only in the plane direction but also three-dimensionally, and the distance in the depth direction between the respective lamination patterns is also shortened.

Since the semiconductor device contains a light-transmitting material, when optical measurement is performed, mixing of signals from other than the pattern of the measurement object becomes a factor of measurement noise, thereby reducing measurement sensitivity. Noise due to signal mixing becomes more pronounced/significant as the distance between the stacked patterns becomes shorter.

In Critical Dimension (CD) metrology, which measures the dimensions of a device, a signal derived from an underlying pattern other than the pattern of a process to be measured in the vicinity of the surface becomes measurement noise, which may reduce the measurement accuracy.

In the conventional overlay measurement, in addition to the device pattern, a pattern for overlay measurement with a larger dimension than the device pattern was formed and measured, but due to the miniaturization of the device pattern, the error between the overlay measurement result in the pattern exclusively formed for overlay measurement and the overlay of the actual device is increasing. Accordingly, overlay measurement using a device pattern is required. In overlay measurement, when the overlay error of the patterns included in the two layers closest to the surface is measured, signals of the underlying patterns become noise, which may reduce measurement accuracy.

In U.S. Pat. No. 8,054,467, there is a problem in that unnecessary information of underlying layers of devices outside the focus of the optical system is detected together with a signal to be measured.

According to an aspect of the inventive concept, there is provided an optical device. The optical device includes: a light source configured to generate an input light; a pinhole plate on a path of the input light between the light source and an objective lens; a first lens arranged on the path of the input light passing through the pinhole plate and configured to collimate the input light so that the input light becomes a parallel light; an image sensor configured to detect a reflected light generated by the input light passing through the first lens being reflected by a sample; and a noise filter on a path of the reflected light between the image sensor and the objective lens, wherein the noise filter may be configured to remove a part of the reflected light generated by underlying layers below a measurement target layer of the sample among the reflected light.

According to another aspect of the inventive concept, there is provided an optical device. The optical device includes: a point light source configured to generate an input light; a first lens configured to collimate the input light such that the input light becomes a parallel light; an illumination pupil shape controller configured to modify the input light having passed through the first lens; a beam splitter configured to reflect the input light having passed through the illumination pupil shape controller toward a sample, and transmit a reflected light from the sample; an objective lens arranged on an optical path of the input light after the beam splitter, the objective lens configured to focus the input light to the sample, and to collimate the reflected light from the sample such that the reflected light becomes a parallel light; a second lens configured to focus the reflected light passing through the objective lens; a noise filter including a first noise filter plate with a pinhole arranged on a focus of the second lens for the reflected light; and an image sensor configured to detect the reflected light passing through the noise filter, wherein the noise filter may be configured to remove a part of the reflected light generated by underlying layers below a measurement target layer of the sample among the reflected light.

According to another aspect of the inventive concept, there is provided an optical device. The optical device includes: a point light source configured to generate an input light; a first lens configured to collimate the input light such that the input light becomes a parallel light; an illumination pupil shape controller configured to modify the input light passing through the first lens; a first objective lens configured to focus the input light passing through an illumination pupil shape controller toward a sample, the input light being incident obliquely on the sample; a second objective lens configured to collimate the reflected light such that the reflected light generated as the input light is reflected by the sample becomes a parallel light, the reflected light being reflected obliquely with respect to the sample; a second lens configured to focus the reflected light passing through the second objective lens; a noise filter including a first noise filter plate with a pinhole arranged on a focus of the second lens for the reflected light; and an image sensor configured to detect the reflected light passing through the noise filter, and wherein the noise filter may remove a part of the reflected light generated by underlying layers below a measurement target layer of the sample among the reflected light.

According to another aspect of the inventive concept, there is provided a method of manufacturing a semiconductor device. The method includes: acquiring an image of a sample by detecting a reflected light generated by an input light being reflected by the sample; and removing a noise by diffracted light from the image, wherein the acquiring of the image of the sample includes: modifying the input light; focusing the modified input light on the sample; collimating the reflected light so that the reflected light generated as the input light is reflected by the sample becomes a parallel light; and removing a part of the reflected light generated by underlying layers below a measurement target layer of the sample among the reflected light using a pinhole plate including a pinhole, and wherein the diffracted light may be generated by the pinhole plate.

BRIEF DESCRIPTION OF THE DRAWINGS

Embodiments of the inventive concept will be more clearly understood from the following detailed description taken in conjunction with the accompanying drawings in which.

DETAILED DESCRIPTION OF THE EMBODIMENTS

Hereinafter, embodiments of the inventive concept will be described with reference to the drawings.

Figure 1:
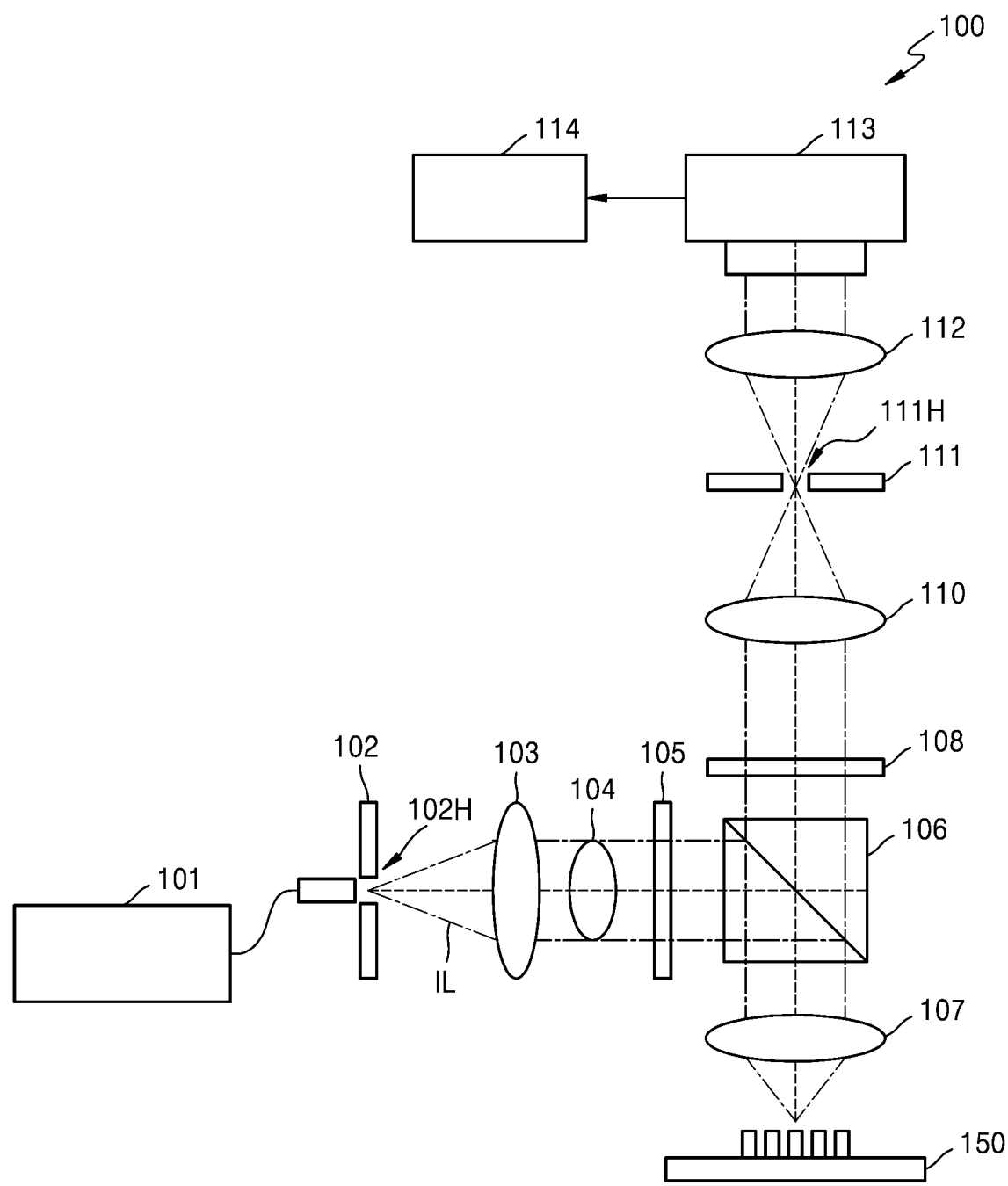
FIG. 1 is a schematic side view illustrating an optical device according to example embodiments.

FIG. 1 is a schematic side view for explaining an optical device 100 according to example embodiments.

Referring to FIG. 1, the optical device 100 may include a light source 101, a pinhole plate 102, a first lens 103, an illumination pupil shape controller 104, a first polarization controller 105, a beam splitter 106, an objective lens 107, a second polarization controller 108, a second lens 110, a noise canceling device 111, a third lens 112, an image sensor 113, and a processor 114.

The light source 101 may generate an input light IL irradiated to a sample 150. As a non-limiting example, the light source 101 may be a laser light source. As a non-limiting example, the light source 101 may be a variable wavelength light source capable of adjusting the wavelength of the input light IL. An embodiment of the variable wavelength light source may include a turret structure including a lamp light source and a plurality of filters. As a non-limiting example, the light source 101 may generate a broadband light.

The pinhole plate 102 may form/modify the input light IL into light generated by a point light source by confining the input light IL generated by the light source 101. The pinhole plate 102 may include, for example, a pinhole 102H that is a circular light-transmitting part on the optical axis of the light source 101. For example, the optical axis of the light source 101 and/or the input light IL may pass through the center of the circular light-transmitting part of the pinhole plate 102.

The input light IL passing through the pinhole plate 102 may be transferred to the first lens 103. According to example embodiments, the first lens 103 may collimate the input light IL passing through the first lens 103. In example embodiments, the input light IL having passed through the first lens 103 may be parallel light.

The input light IL having passed through the first lens 103 may be transferred to the illumination pupil shape controller 104. The illumination pupil shape controller 104 may control a shape of a luminous flux of the input light IL having passed through the first lens 103. The illumination pupil shape controller 104 may include a light-shielding part. As will be described later, by forming/modifying the input light IL by the illumination pupil shape controller 104, in the processing after image detection by the image sensor 113, an interpolation operation for removing diffraction generated in the pinhole 111H of the noise canceling device 111 is enabled. Noise canceling devices described in this disclose may be also referred to as noise filters.

Figure 6:
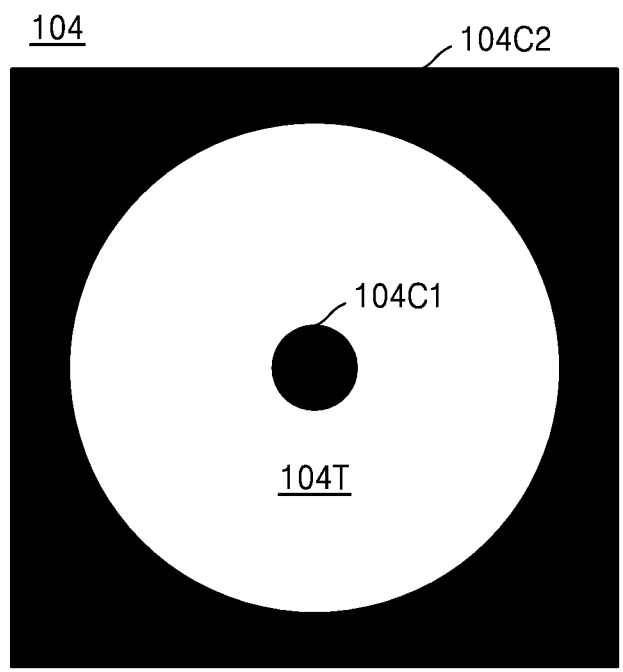
FIG. 6 is a diagram for describing an illumination pupil shape controller of an optical device according to example embodiments.

As shown in FIG. 6, the illumination pupil shape controller 104 may be a ring-shaped filter including a first light-shielding part 104C1 in the center part, a ring-shaped light-transmitting part 140T surrounding the first light-shielding part 104C1, and a second light-shielding part 104C2 of an edge surrounding the ring-shaped light-transmitting part 140T. Accordingly, the beam cross-section of the input light IL having passed through the illumination pupil shape controller 104 may have a ring shape.

The input light IL passing through the illumination pupil shape controller 104 may be transferred to the first polarization controller 105. The first polarization controller 105 may transmit a preset polarization component among the input light IL from the illumination pupil shape controller 104.

The input light IL passing through the first polarization controller 105 may be transferred to the beam splitter 106. The beam splitter 106 may transfer the input light IL to the objective lens 107 by reflecting the input light IL from the first polarization controller 105. The objective lens 107 may focus the input light IL coming from the beam splitter 106 on the surface of the sample 150 to be measured/inspected.

In addition, the objective lens 107 may refract the reflected light RL from the sample 150. The reflected light RL refracted by the objective lens 107 may be collimated to be parallel light, but is not limited thereto.

The reflected light RL passing through the objective lens 107 may be transferred to the beam splitter 106. The beam splitter 106 may transmit the reflected light RL.

The reflected light RL passing through the beam splitter 106 may be transferred to the second polarization controller 108. The second polarization controller 108 may transmit a preset polarization component among the reflected light RL passing through the beam splitter 106.

The reflected light RL passing through the second polarization controller 108 may be transferred to the second lens 110. The second lens 110 may focus the reflected light RL on the pinhole 111H of the noise canceling device 111. Accordingly, the focus of the reflected light RL passing through the second lens 110 may be on the pinhole 111H of the noise canceling device 111.

The reflected light RL passing through the second lens 110 may be transferred to the noise canceling device 111. The noise canceling device 111 may include, for example, a pinhole 111H that is a circular light-transmitting part on the optical axis of the reflected light RL. For example, the optical axis of the reflected light RL may pass through the center of the circular light-transmitting part of the noise canceling device 111.

The noise canceling device 111 may be arranged on a sample conjugate plane with respect to the optical axis direction. Also, the center of the pinhole 102H of the pinhole plate 102 may be on the optical axis of the input light IL, and the center of the pinhole 111H of the noise canceling device 111 may be on the optical axis of the reflected light RL.

The noise canceling device 111 may be a pinhole plate including the pinhole 111H. The noise canceling device 111 may remove the reflected light RL of layers (e.g., the underlying layers 130 (see FIG. 2)) other than the measurement target layers 151 (see FIG. 2) (e.g., two layers from the surface) of the sample 150.

The reflected light RL passing through the noise canceling device 111 may be transferred to the third lens 112. The third lens 112 may collimate the reflected light RL so that the reflected light RL having passed through the noise canceling device 111 becomes parallel light, e.g., after the reflected light RL pass through the third lens 112.

The reflected light RL passing through the third lens 112 may be transferred to the image sensor 113. The image sensor 113 may receive and detect the reflected light RL coming from the third lens 112. The image sensor 113 may include a charge-coupled device (CCD) camera and/or a complementary metal-oxide-semiconductor (CMOS) image sensor. The image sensor 113 may be installed on the pupil plane.

With the above configuration, the optical device 100 may be configured to measure the surface of the sample 150. Next, an operating principle of the optical device 100 will be described.

Next, a principle of blocking a component reflected from the underlying layers that are two layers below from the surface of the sample to be measured/inspected among the reflected light RL will be described.

Figure 2:
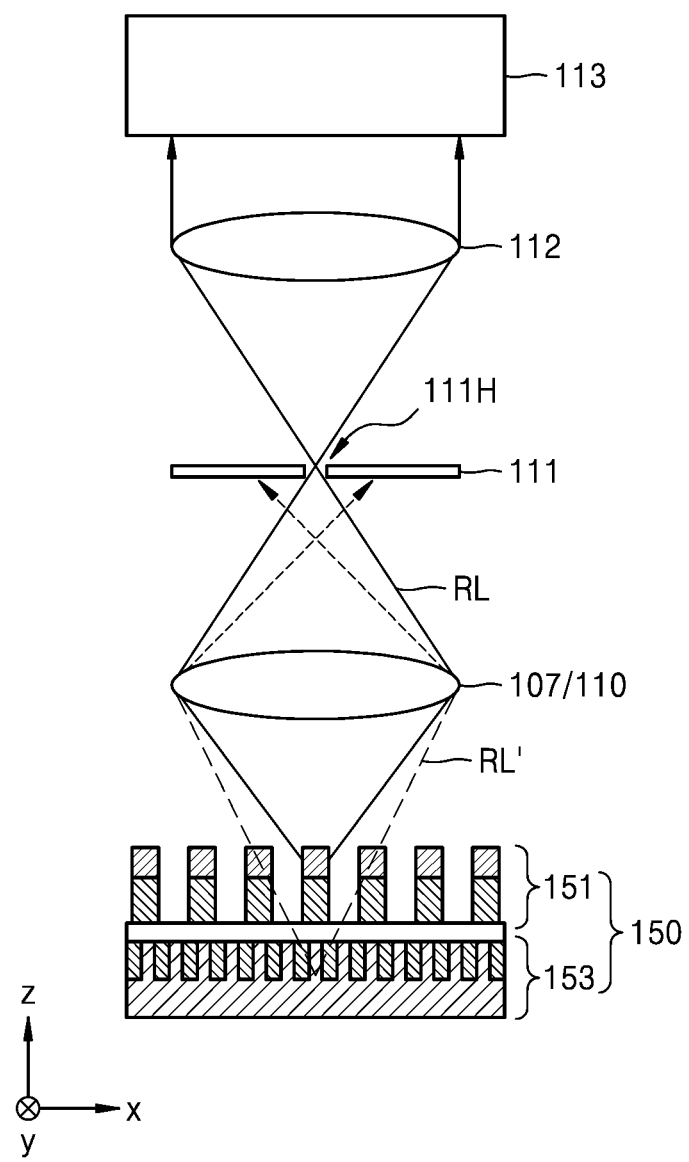
FIG. 2 is a diagram illustrating part of an optical device according to example embodiments.

FIG. 2 is a schematic diagram illustrating a part of the optical device 100 of FIG. 1. Because the reflected light RL from the sample 150 will be described with reference to FIG. 2, the light source 101, the pinhole plate 102, the first lens 103, the first polarization controller 105, and the illumination pupil shape controller 104 are omitted in FIG. 2. For convenience of illustration, the objective lens 107 and the second lens 110 are illustrated as a single lens. In addition, because the configuration for cutting the light reflected from the portion of the second layer or less from the surface of the sample 150 to be measured is described with reference to FIG. 2, the second polarization controller 108 is omitted in FIG. 2.

For example, when the sample 150 has a stacked structure like a semiconductor device, in addition to the reflected light RL reflected from the measurement target layers 151 adjacent to the surface of the sample shown by the solid line, the reflected light RL' reflected from the pattern of the underlying layers 153 below the measurement target layers 151 travels along the optical system from the objective lens 107 to the second lens 110.

In the conventional inspection method, light reflected from the pattern of underlying layers below the measurement target layers reaches the image sensor. The intensity distribution obtained by the image sensor is influenced by the pattern of the underlying layers 153 below the measurement target layers 151, and the influence of the pattern of the underlying layers 153 below the measurement target layers 151 is measurement noise.

As providing the noise canceling device 111 to the conjugate plane of the sample 150, the optical device 100 according to example embodiments may pass the reflected light RL from the measurement target layer 151 focused on the pinhole 111H of the noise canceling device 111 by a confocal effect, and remove the reflected light RL' from the underlying layers 153 defocused to the pinhole 111H of the noise canceling device 110. For example, when the sample 150 is a semiconductor device, by detecting only a pattern in the measurement target layers 151 with the image sensor 113, a higher-sensitivity measurement becomes possible.

Figure 3:
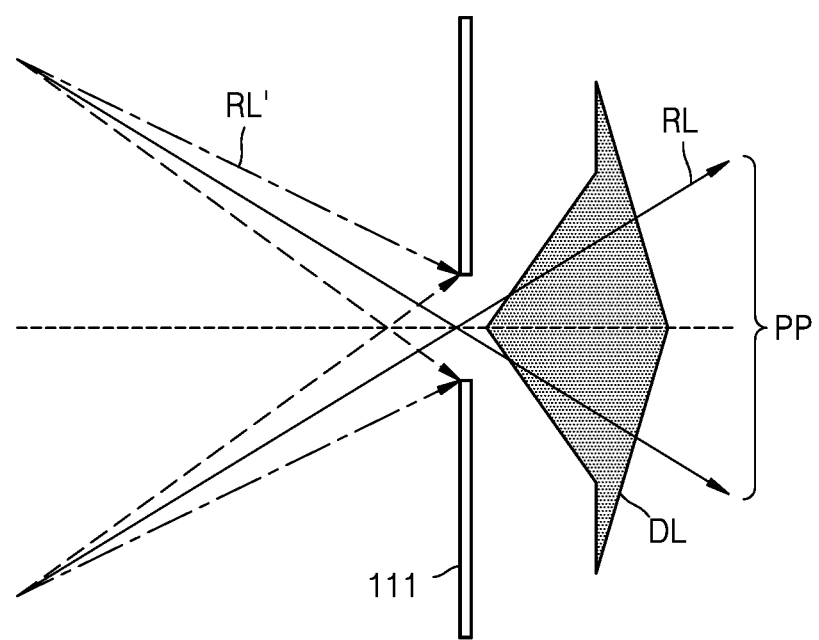
FIG. 3 is a diagram for describing a noise canceling device according to example embodiments.

Next, the noise canceling device 111 will be described in more detail. FIG. 3 is a diagram illustrating an example of light diffracted by a pinhole of the pinhole plate 111.

Referring to FIGS. 1 to 3, the reflected light RL indicated in FIG. 3, which is an in-focus light beam, is focused on the pinhole 111H of the noise canceling device 111, so the reflected light RL may pass through the noise canceling device 111.

On the other hand, a portion of the reflected light RL' of FIG. 2, which is a defocus ray removed near the inner perimeter defining the pinhole 111H of the noise canceling device 111, generates the diffracted light DL by the inner perimeter of the noise canceling device 111. This diffracted light DL generates an intensity distribution by the diffracted light DL that has no relation to the intensity distribution in the pupil plane of the reflected light RL generated by the structure of the measurement target layers 151 of the sample 150, and reaches on the image sensor 113 so that the diffracted light DL becomes measurement noise.

Figure 4A:
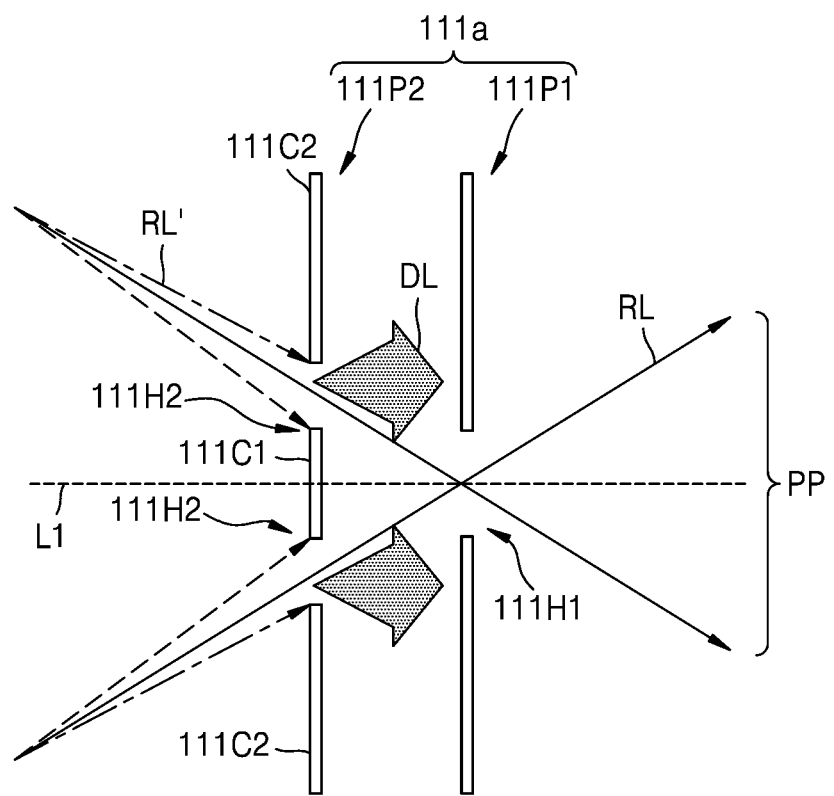
FIGS. 4A and 4B are diagrams for explaining a noise canceling device according to example embodiments.

FIG. 4A is a diagram for explaining a noise canceling device 111a according to other example embodiments.

FIG. 4A is a diagram illustrating an example of noise cancellation by a noise canceling device 111a of an optical device according to example embodiments. FIG. 4A is also a cross-sectional view of the noise canceling device 111a. The noise canceling device 111a may be alternatively employed with respect to the noise canceling device 111 of FIG. 1. For example, the noise canceling device 111a of FIG. 4A may a substitute of the noise canceling device 111 of FIG. 1 in certain embodiments.

Referring to FIG. 4A, the noise canceling device 111a may include a first noise canceling plate 111P1 and a second noise canceling plate 111P2. According to example embodiments, the reflected light RL may pass through the first noise canceling plate 111P1 after passing through the second noise canceling plate 111P2. Noise canceling plates described in this disclosure may also be referred to as noise filter plates.

Similarly to the noise canceling device 111 of FIG. 3, the first noise canceling plate 111P1 may be a pinhole plate including a pinhole 111H1 that is a circular light-transmitting part. The first noise canceling plate 111P1 may be arranged on the imaging surface of the reflected light RL. The pinhole 111H1 of the first noise canceling plate 111P1 may be on a focal point for the second lens 110 (see FIG. 1) of the reflected light RL.

The second noise canceling plate 111P2 may include a circular first light-shielding part 111C1 on the central optical axis, a first ring-shaped light-transmitting part 111H2 surrounding the circular first light-shielding part 111C1, and a second light-shielding part 111C2 surrounding the circular first light-shielding part 111C1 and the first ring-shaped light-transmitting part 111H2.

The center of the circular first light-shielding part 111C1 of the second noise canceling plate 111P2 and the center of the pinhole 111H1 of the first noise canceling plate 111P1 may be arranged on the same straight line L1 (e.g., the optical axis of the reflected light RL).

In FIG. 4A, the reflected light RL focused on the pinhole 111H1 may pass through the second noise canceling plate 111P2 and the first noise canceling plate 111P1. And, a portion of the reflected light RL' defocused with respect to the first noise canceling plate 111P1 is diffracted by the second noise canceling plate 111P2, so that the diffracted light DL may be generated, e.g., from the defocused reflected light RL'. For example, the defocused reflected light RL' may be turned into the diffracted light DL while passing through the second noise canceling plate 111P2. Thereafter, the diffracted light DL may be blocked by the first noise canceling plate 111P1. As a result, a majority of the diffracted light DL may be blocked by the noise canceling device 111a.

Figure 4B:
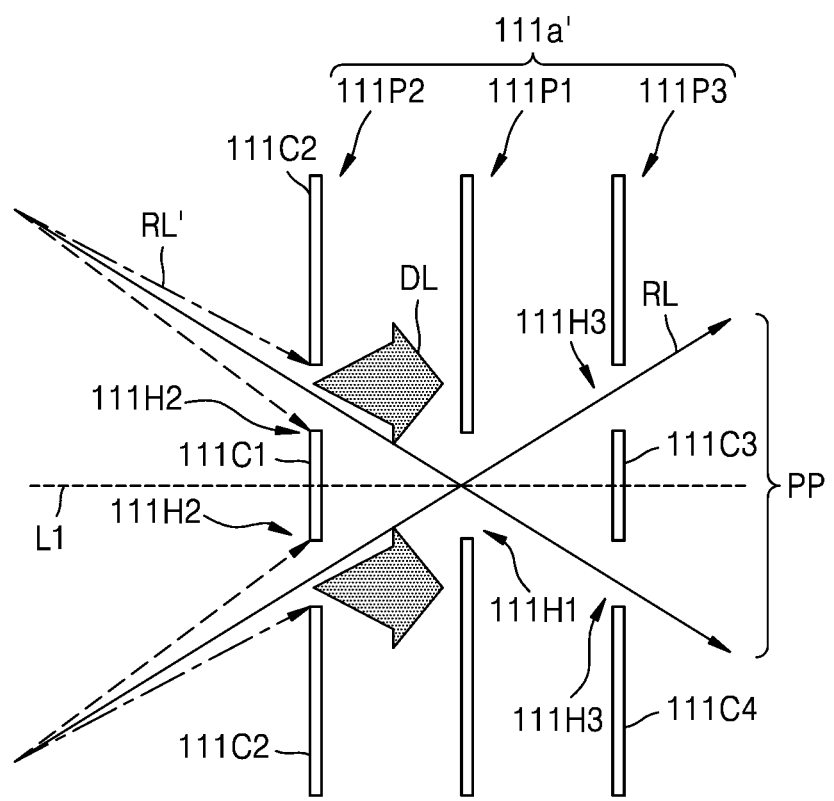

FIG. 4B is a diagram for explaining a noise canceling device 111a' according to other example embodiments.

Referring to FIG. 4B, the noise canceling device 111a' may include a first noise canceling plate 111P1, a second noise canceling plate 111P2, and a third noise canceling plate 111P3 arranged along the direction of the reflected light RL and RL'. For example, the first noise canceling plate 111P1, the second noise canceling plate 111P2, and the third noise canceling plate 111P3 may be arranged along the optical axis of the reflected light RL and/or the optical axis of the reflected light RL'.

Since the first noise canceling plates 111P1 and the second noise canceling plate 111P2 are the same or substantially the same as those described with reference to FIG. 4A, redundant descriptions thereof will be omitted.

Terms such as "same," "equal," "planar," or "coplanar," as used herein encompass identicality or near identicality including variations that may occur, for example, due to manufacturing processes. The term "substantially" may be used herein to emphasize this meaning, unless the context or other statements indicate otherwise.

The third noise canceling plate 111P3 may include a circular third light-shielding part 111C3 on the central optical axis, a second ring-shaped light-transmitting part 111H3 surrounding the circular third light-shielding part 111C3, and a fourth light-shielding part 111C4 surrounding the circular third light-shielding part 111C3 and the second ring-shaped light-transmitting part 111H3.

According to example embodiments, the reflected light RL transmitted through the pinhole 111H1 may pass through the second ring-shaped light-transmitting part 111H3. In addition, the third and fourth light-shielding parts 111C3 and 111C4 may block the diffracted light DL having passed through the first noise canceling plates 111P1.

Figure 5A:
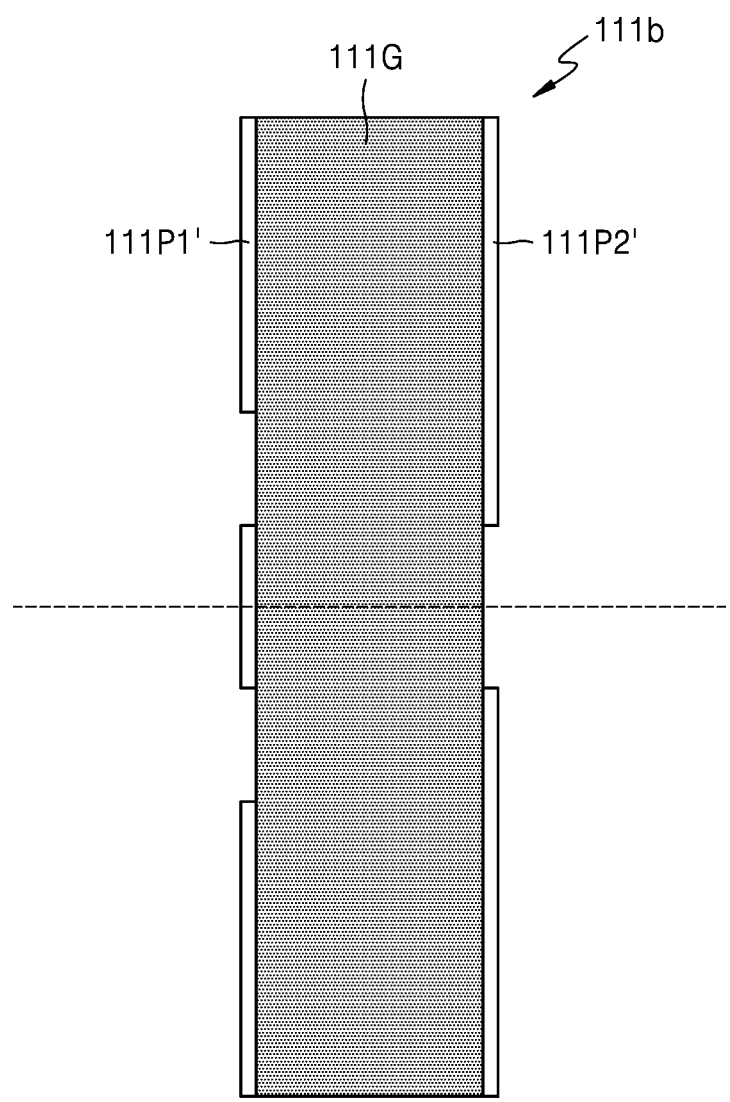
FIGS. 5A to 5C are diagrams for explaining a noise canceling device according to example embodiments.

FIG. 5A is a diagram for explaining a noise canceling device 111b according to other example embodiments.

Figure 5B:
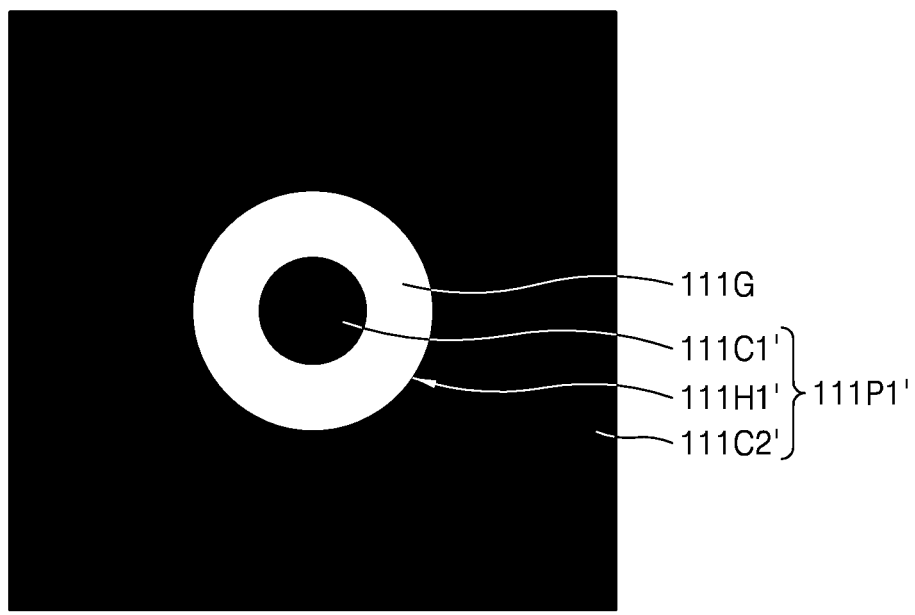

FIG. 5B is a plan view of the noise canceling device 111b viewed from the side of a first noise canceling plate 111P1' of the noise canceling device 111b according to example embodiments.

Figure 5C:
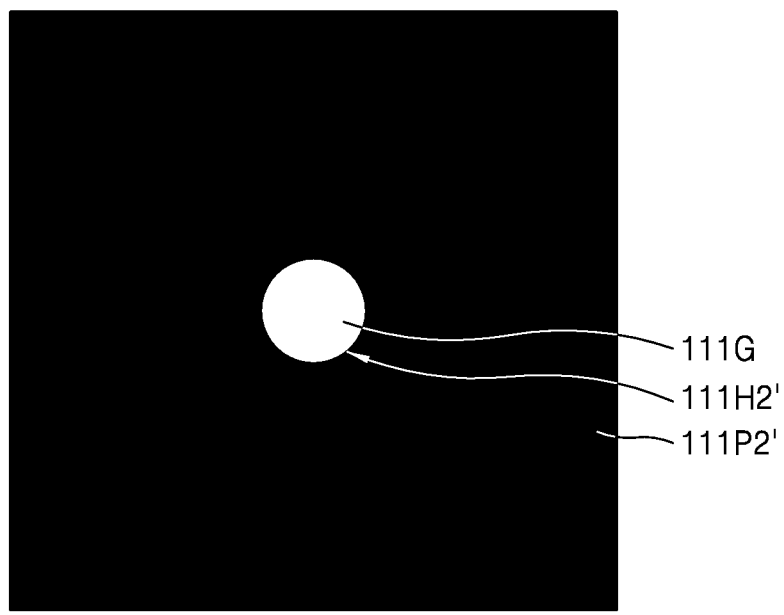

FIG. 5C is a plan view of the noise canceling device 111b as viewed from the side of a second noise canceling plate 111P2' of the noise canceling device 111b according to example embodiments.

Referring to FIGS. 5A to 5C, the noise canceling device 111b may include a first noise canceling plate 111P1', a second noise canceling plate 111P2', and a light-transmitting plate 111G arranged between the first noise canceling plate 111P1' and the second noise canceling plate 111P2'.

In example embodiments, the light-transmitting plate 111G may include or be formed of a light-transmitting material such as glass or quartz.

The first noise canceling plate 111P1' and the second noise canceling plate 111P2' may be layers of a light absorbing material such as chrome coated on the light-transmitting plate 111G.

The first noise canceling plate 111P1' may include a circular first light-shielding part 111C1' on the central optical axis, a ring-shaped transmission part 111H1' surrounding the circular first light-shielding part 111C1', and a second light-shielding part 111C2' surrounding the circular first light-shielding part 111C1' and the ring-shaped light-transmitting part 111H1'.

The second noise canceling plate 111P2' may include a pinhole 111H2' that is a circular transmission part.

Based on what is described herein, a person skilled in the art will be able to implement an embodiment easily, in which the noise canceling device 111a of FIG. 4a, the noise canceling device 111a' of FIG. 4b, and the noise canceling device 111b of FIG. 5a are alternatively employed instead of the noise canceling device 111 of the optical device 100 of FIG. 1.

FIG. 6 is a diagram showing an example of the illumination pupil shape controller 104 of the optical device according to an embodiment.

Referring to FIG. 6, the illumination pupil shape controller 104 may include a first light-shielding part 104C1 placed on the center, a ring-shaped light-transmitting part 104T surrounding the first light-shielding part 104C1, and a second light-shielding part 104C2 surrounding the first light-shielding part 104C1 and the ring-shaped light-transmitting part 104T. Accordingly, the input light IL (see FIG. 1) passing through the illumination pupil shape controller 104 may be formed/modified to have a ring-shaped beam cross-section. Also, the illumination pupil shape controller 104 may include a spatial modulator such as a Digital Micromirror Device (DMD).

According to example embodiments, the distribution of the remaining diffracted light is calculated using the illumination pupil shape controller 104.

Figure 7:
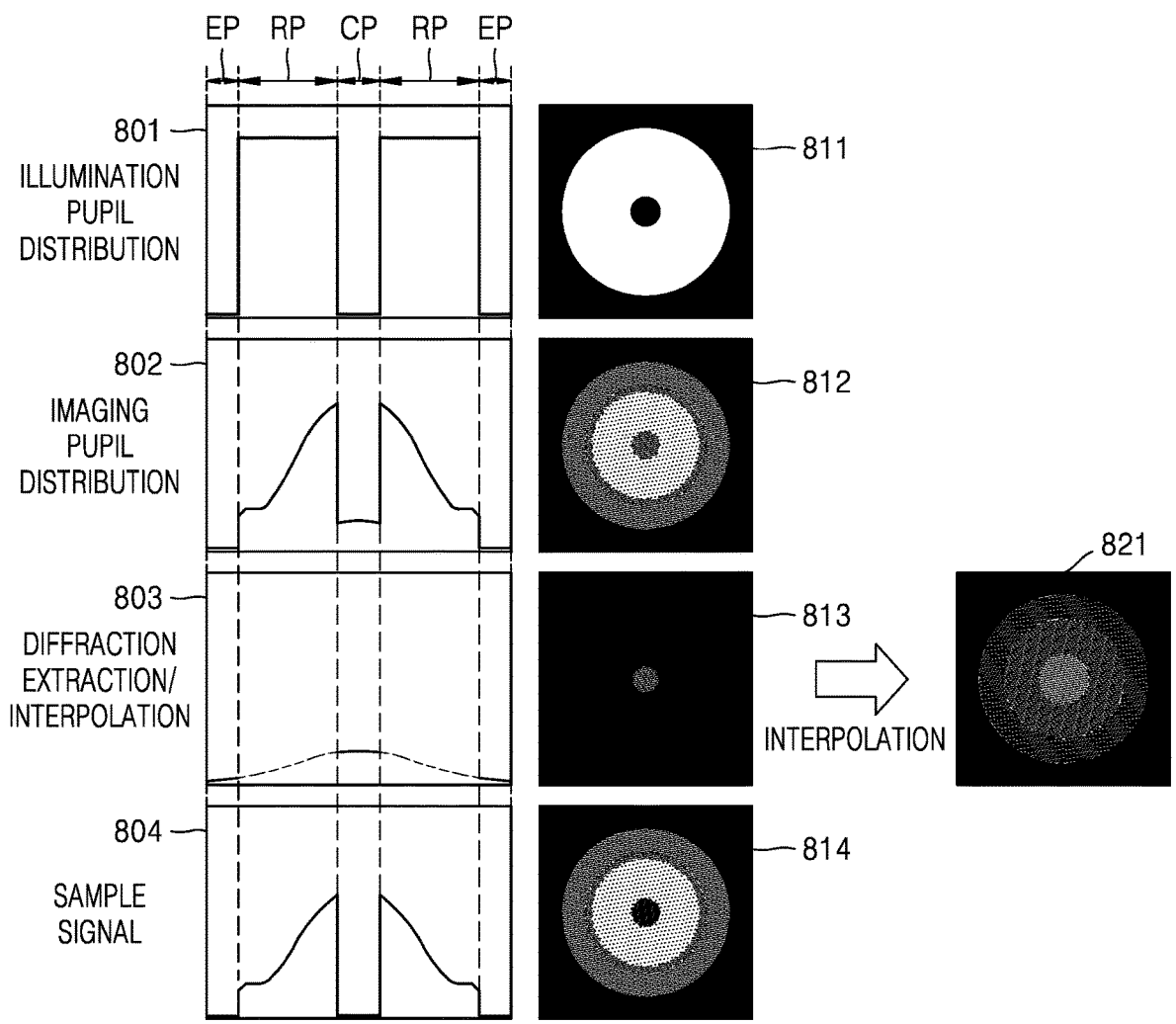
FIG. 7 is a diagram for explaining a series of operations for removing noise of an optical device according to example embodiments.

FIG. 7 is a diagram illustrating an example of intensity distribution processing of the optical device 100 using the illumination pupil shape controller 104 according to example embodiments. In the graphs 801, 802, 803, and 804, the horizontal axis indicates the distance from the optical axis, and the vertical axis indicates the intensity of light.

Referring to FIGS. 1, 6, and 7, the central portion CP and the edge portion EP of the luminous flux of the incident light IL passing through the illumination pupil shape controller 104 may be removed. Therefore, as shown in the graph 801, the light intensity of the central portion CP of the luminous flux corresponding to the first light-shielding part 104C1 and the light intensity of the edge portion EP of the luminous flux corresponding to the second light-shielding part 104C2 are about 0. In this example, the intensity of a ring-shaped part RP arranged between the center part CP and the edge part EP and corresponding to the ring-shaped light-transmitting part 104T is substantially constant with respect to the distance from the optical axis. The image 811 represents the intensity of the luminous flux of the incident light IL in a plane perpendicular to the optical axis, which is corresponding to the graph 801.

The intensity distribution of the reflected light RL from the sample 150 reaching the image sensor 113 is the same as the graph 802. Referring to the graph 802, the intensity distribution of the diffracted light DL (see FIG. 3) generated by the noise canceling device 111 appears in the center part CP and the edge part EP corresponding to the first and second light-shielding parts 104C1 and 104C2 of the illumination pupil shape controller 104. Image 812 represents the intensity of the luminous flux of reflected light RL in a plane perpendicular to the optical axis, which is corresponding to graph 802.

Subsequently, the optical device 100 may extract the intensity of the center part CP and the edge part EP blocked by the illumination pupil shape controller 104 from the distribution of the graph 802. Accordingly, the solid line portion of the graph 803 may be obtained. The image 813 represents the intensity of the luminous flux of the diffracted light DF (see FIG. 3) in a plane perpendicular to the optical axis, which is according to the solid line portion of the graph 803.

Then, through the interpolation operation based on the extracted intensity distribution, e.g., the intensity distribution of the center part CP and the edge part EP shown as a solid line in the graph 803, the intensity distribution of the diffracted light DF (see FIG. 3) of the non-extracted part, e.g., the ring-shaped part RP, may be calculated. The intensity distribution of the ring-shaped part RP is shown as a dashed line in the graph 803. The intensity distribution of the entire graph 803 obtained by extraction and interpolation may be interpreted as an intensity distribution by the diffracted light DF (see FIG. 3) generated by the noise canceling device 111. The image 821 represents the intensity of the luminous flux of the diffracted light DF (see FIG. 3) in a plane perpendicular to the optical axis along with the solid line portion of the graph 803. The image 821 may be a noise image representing noise expressed by the diffracted light DF (see FIG. 3).

Then, the optical device 100 may subtract the intensity distribution of the pupil by the diffracted light DL (e.g., any one of the graph 803 and the image 821) from the intensity distribution of the pupil measured by the image sensor 113 (e.g., any one of the graph 802 and the image 812). For example, the optical device 100 may subtract the intensity of the diffracted light DF from the measured intensity by the image sensor 113. Accordingly, the optical device 100 may obtain a signal of the reflected light RL derived from only the measurement target layers 151 of the measurement sample 150.

Therefore, image 814 is obtained by subtracting the image 821 from the image 812. Such processing may be performed by a processor 114 included in the optical device 100 or an external processor for analyzing data generated by the optical device 100.

The above-described measurement method by the optical device 100 may simultaneously measure all incident angles and all azimuth angles whose positions in the pupil plane correspond to incident angles and azimuth angles of illumination with respect to the sample using the intensity distribution according to the position on the pupil plane. Accordingly, processing such as reflectometry, ellipsometry, polarimetry, and scatterometry is performed on the measurement result of the optical device 100, and the measurement value of the measurement sample structure is calculated.

The measurement method described above with reference to FIGS. 6 and 7 may also be similarly applied to embodiments in which the noise canceling device 111a of FIG. 4 and/or the noise canceling device 111b of FIG. 5A are alternatively employed in the position of the noise canceling device 111 of the optical device 100.

Figure 8:
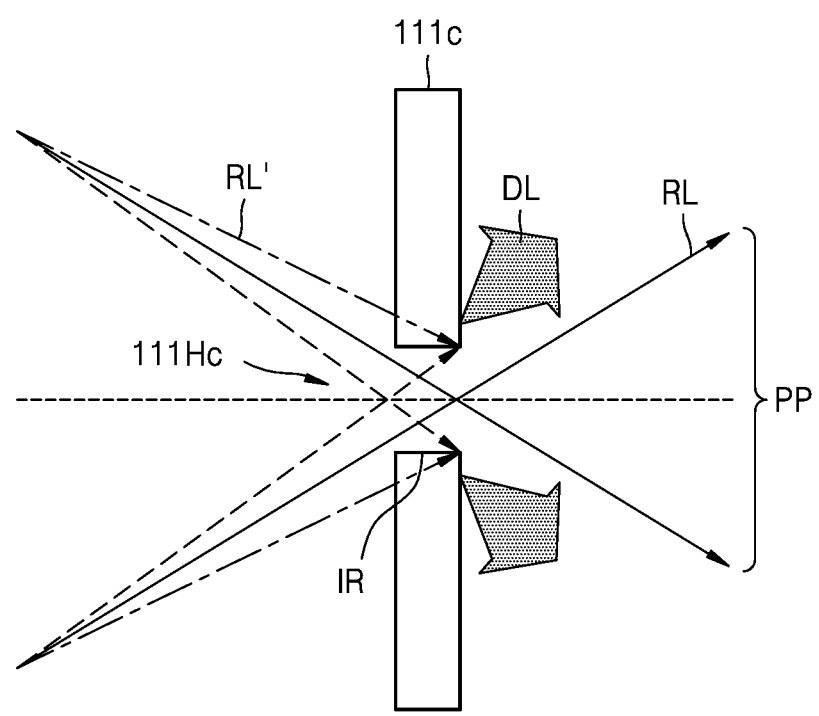
FIG. 8 is a diagram for describing a noise canceling device according to example embodiments.

FIG. 8 is a diagram illustrating an example of noise cancellation by a noise canceling device 111c of an optical device 100 according to example embodiments.

Referring to FIGS. 1 and 8, the noise canceling device 111c may be a light-transmitting substrate including a pinhole 111Hc that is a circular hole. The center of the pinhole 111Hc may be on the optical axis of the optical device 100.

According to example embodiments, the noise canceling device 111c may include or be formed of a light-transmitting material. As a non-limiting example, the noise canceling device 111c may include or be formed of quartz and glass.

The noise canceling device 111c is designed so that the phase difference between the light passing through the pinhole 111Hc and the light passing through the light-transmitting material/substrate of the noise canceling device 111c near the pinhole 111Hc becomes half the wavelength of the input light IL. The noise canceling device 111c may have a thickness such that the phase difference between the light passing through the pinhole 111Hc and the light passing through the light-transmitting material/substrate of the noise canceling device 111c near the pinhole 111Hc becomes half the wavelength of the input light IL. For example, the phase difference between the light passing through the light-transmitting material/substrate of the noise canceling device 111c and the light passing through the pinhole 111Hc may be a half wavelength.

Due to the phase shift of the half wavelength, the component of the straight direction (e.g., in a direction parallel to the optical axis of the optical device 100) of the diffracted light incident on the inner perimeter IR of the pinhole 111Hc of the noise canceling device 111c may be canceled. Accordingly, the diffracted light DL incident on the inner perimeter IR of the pinhole 111Hc of the noise canceling device 111c is irradiated to a position outside the pupil of the image sensor 113 through diffraction.

In the above embodiment, because the light diffracted by the noise canceling device 111c is directed out of pupil position of the image sensor 113, measurement noise may be reduced.

However, this inventive concept is not limited to the embodiment, and appropriate changes may be made without departing from the purpose. For example, a person of ordinary skill in the art will be able to easily reach an optical device including a noise canceling device with two first noise canceling plates 111P1 of FIG. 4A and one second noise canceling plate 111P2 of FIG. 4A arranged therebetween.

The processor 114 for processing the signal of the image sensor 113 may include a central processing unit (CPU), a memory, and other circuits in its hardware, and may be implemented with a program loaded into the memory as a software. Accordingly, it will be understood by those skilled in the art that these functional blocks may be implemented in various forms with hardware only, software only, or a combination thereof, and are not limited thereto.

The above-described program may be stored using various types of non-transitory computer-readable media and supplied to the computer. Non-transitory computer-readable media may include or may be one of various types of tangible recording media. Examples of non-transitory computer-readable media include magnetic recording media (e.g., flexible disks, magnetic tapes, and hard disk drives), magneto-optical recording medium (e.g., an optical magnetic disk), compact disc read-only memory (CD-ROM), CD-recordable (CD-R), CD-rewritable (CD-R/W), semiconductor memory (e.g., mask read-only memory (ROM), programmable ROM (PROM), erasable PROM (EPROM), flash ROM, and random access memory (RAM)). Further, the program may be supplied to the computer by various types of transitory computer-readable media. Examples of transitory computer-readable media include electrical signals, optical signals, and electromagnetic waves. The temporary computer-readable medium may supply a program to the computer through a wired communication path such as an electric wire and optical fiber, or a wireless communication path.

Figure 9:
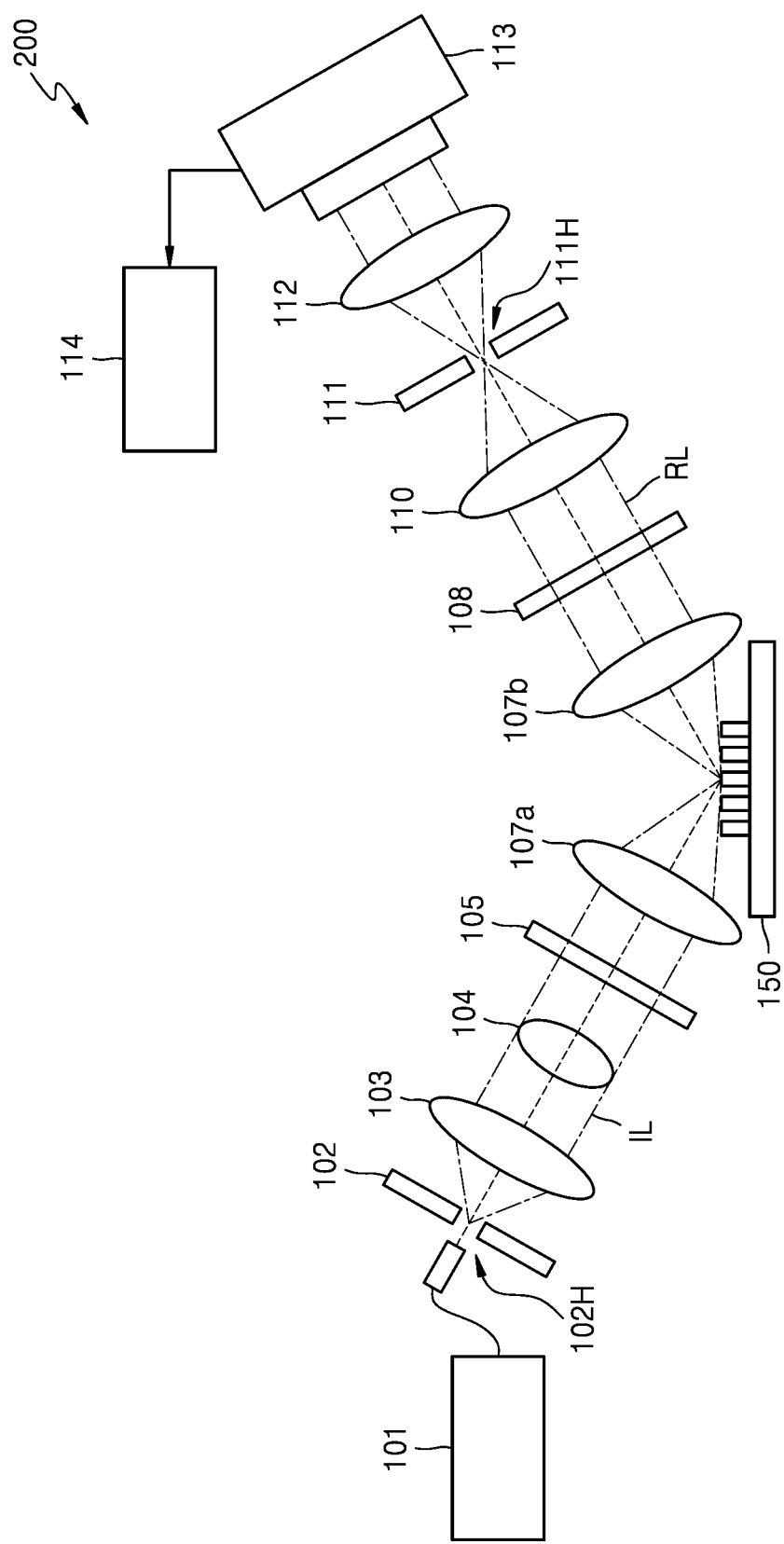
FIG. 9 is a schematic side view illustrating an optical device according to example embodiments.

FIG. 9 is a diagram for describing an optical device 200 according to example embodiments.

Referring to FIG. 9, the optical device 200 may include an inclination optical system, unlike the optical device 100 configured with the vertical optical system of FIG. 1. For example, in the optical device 100, the input light IL may be incident on the substrate sample (e.g., on a top surface of the substrate sample) perpendicularly, and in the optical device 200, the input light IL may be incident on the substrate sample (e.g., on a top surface of the substrate sample) in an inclined/oblique direction.

The optical device 200 may include a light source 101, a pinhole plate 102, a first lens 103, an illumination pupil shape controller 104, a first polarization controller 105, a first objective lens 107a, a second objective lens 107b, a second polarization controller 108, a second lens 110, a noise canceling device 111, a third lens 112, an image sensor 113, and a processor 114.

Except for constituting the inclination/oblique optical system, the light source 101, the pinhole plate 102, the first lens 103, the illumination pupil shape controller 104, the first polarization controller 105, the second polarization controller 108, the second lens 110, the noise canceling device 111, the third lens 112, the image sensor 113, and the processor 114 are the same or substantially the same as those described with reference to FIG. 1, and therefore, a redundant description thereof will be omitted.

The first objective lens 107a may focus the input light IL passing through the first polarization controller 105 on the sample 150. The second objective lens 107b may collimate the reflected light RL so that the reflected light RL becomes a parallel light. The reflected light RL passing through the second objective lens 107b may reach the second polarization controller 108.

Figure 10:
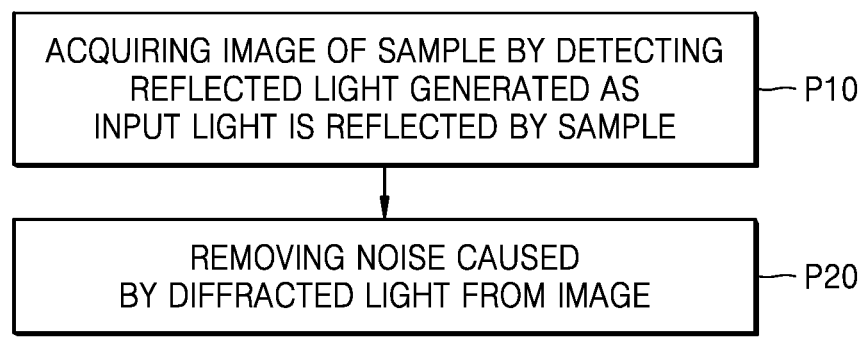
FIG. 10 is a flowchart illustrating a method of inspecting a semiconductor device according to example embodiments.

FIG. 10 is a flowchart illustrating a method of inspecting a semiconductor device according to example embodiments.

Referring to FIGS. 1, 2, and 10, a semiconductor device inspection method according to example embodiments may include acquiring an image of the sample 150 by detecting the reflected light RL generated as the input light IL is reflected by the sample 150 in P10 and removing noise by the diffracted light from the image in P20.

In P10, the acquiring of the image of the sample 150 is more particularly as follows.

The light source 101 and the pinhole plate 102 may constitute a point light source, and the input light IL emitted from the point light source may be collimated to become parallel light by the first lens 103. The collimated input light IL may be formed to have a ring-shaped beam cross-section by the illumination pupil shape controller 104, and after passing through the first polarization controller 105, the collimated input light IL may be reflected by the beam splitter 106 and directed to the objective lens 107. The input light IL may be focused by the objective lens 107 onto the sample 150 such as a wafer on which a semiconductor device is formed.

After the reflected light RL is generated when the input light RL is reflected by the sample 150, and collimated by the objective lens 107, the reflected light RL may pass through the beam splitter 106 and the second polarization controller 108. Subsequently, the reflected light RL may form an intermediate image by the second lens 110. The noise canceling device 111 may be installed at the intermediate image position (i.e., the focus of the second lens 110 with respect to the reflected light RL) of the reflected light RL. As described with reference to FIGS. 1 to 6, the noise canceling device 111 may remove the reflected light RL' generated from the underlying layers 153 below the measurement target layers 151 of the sample 150. The reflected light RL passing through the noise canceling device 111 may be collimated to become a parallel light by the third lens 112, and the image sensor 113 installed on the pupil plane of the reflected light RL may detect the reflected light RL.

In P20, as described with reference to FIG. 8, the removing of the noise by the diffracted light from the image may include extracting a radius-intensity distribution of the center part of the image of the sample 150 and a radius-intensity distribution of the part corresponding to the edge part of the input light, calculating a noise image by the diffracted light by performing an interpolation operation based on the radius-intensity distribution of the center part and the radius-intensity distribution of the edge part, and performing a subtraction operation between the image and the noise image (e.g., a subtraction of the noise image from the measured image). For example, the radius-intensity distribution of the center part of the image may be an intensity distribution of light within a certain distance from the center of the image of the sample 150, and the radius-intensity distribution of the part corresponding to the edge part may be an intensity distribution of light in a range longer than a certain distance from the center of the input light.

In an example embodiment of the present disclosure, a method of manufacturing a semiconductor device is provided. The method of manufacturing the semiconductor device may include providing a substrate, forming one or a plurality of pattern layers on the substrate, and performing an inspection of the patterns of the one or the plurality pattern layers. In performing the inspection, the above described semiconductor device inspection method may be adopted.

While the inventive concept has been particularly shown and described with reference to embodiments thereof, it will be understood that various changes in form and details may be made therein without departing from the spirit and scope of the following claims.

What is claimed is:

1. An optical device comprising:
a light source configured to generate an input light;
a pinhole plate on a path of the input light between the light source and an objective lens;
a first lens arranged on the path of the input light passing through the pinhole plate, the first lens configured to collimate the input light so that the input light becomes parallel light;
an image sensor configured to detect a reflected light generated by the input light passing through the first lens and being reflected by a sample; and
a noise filter on a path of the reflected light between the image sensor and the objective lens,
wherein the noise filter is configured to remove part of the reflected light generated by underlying layers below a measurement target layer of the sample,
wherein the noise filter comprises a first noise filter plate including a first light-shielding part of a circular shape, a ring-shaped light-transmitting part surrounding the first light-shielding part, and a second light-shielding part surrounding the ring-shaped light-transmitting part,
wherein the noise filter further comprises a second noise filter plate including a circular pinhole, and
wherein the first noise filter plate and the second noise filter plate are arranged such that the reflected light generated by the underlying layers below the measurement target layer of the sample is diffracted by the first noise filter plate, thereby forming a diffracted light, and the diffracted light is blocked by the second noise filter plate.

2. The optical device of claim 1, further comprising:
a second lens on the path of the reflected light between the objective lens and the noise filter,
wherein the objective lens is on the path of the reflected light; and
wherein a focus of the second lens is on the noise filter.

3. The optical device of claim 2, wherein the noise filter comprises a pinhole on the focus of the second lens for the reflected light.

4. The optical device of claim 3, wherein the pinhole of the noise filter is configured that the reflected light generated from the measurement target layer of the sample passes through the pinhole of the noise filter, and
wherein the noise filter is configured that the reflected light generated by the underlying layers below the measurement target layer of the sample is blocked by the noise filter.

5. The optical device of claim 1, wherein the noise filter further comprising a light-transmitting plate between the first noise filter plate and the second noise filter plate.

6. The optical device of claim 1, further comprising an illumination pupil shape controller arranged on the path of the input light between the first lens and the objective lens and configured to modify the input light.

7. The optical device of claim 6, wherein the illumination pupil shape controller is configured to modify the input light so that a beam cross-section of the input light becomes a ring shape.

8. The optical device of claim 6, wherein the illumination pupil shape controller comprises:
a first light-shielding part of a circular shape;
a ring-shaped light-transmitting part surrounding the first light-shielding part; and
a second light-shielding part surrounding the ring-shaped light-transmitting part.

9. The optical device of claim 8, further comprising a processor configured to extract, from an image measured by the image sensor, a radius-intensity distribution of a center part corresponding to the first light-shielding part and a radius-intensity distribution of an edge part corresponding to the second light-shielding part.

10. The optical device of claim 9, wherein the processor is configured to calculate a radius-intensity distribution of a diffracted light of a ring-shaped part between the center part and the edge part, based on the radius-intensity distribution of the center part and the radius-intensity distribution of the edge part.

11. The optical device of claim 9, wherein the processor is configured to calculate a noise image of a diffracted light generated by the noise filter, by calculating the radius-intensity distribution of a ring-shaped part between the center part and the edge part through an interpolation operation based on the radius-intensity distribution of the center part and the radius-intensity distribution of the edge part.

12. The optical device of claim 9, wherein the processor is configured to perform calculation of a difference between the image measured by the image sensor and a noise image generated by the processor.

13. The optical device of claim 9, wherein the noise filter is a light-transmitting substrate including a pinhole.

14. The optical device of claim 13, wherein a phase difference between the reflected light passing through the pinhole of the noise filter and the reflected light passing through light-transmitting substrate of the noise filter is a half wavelength of the reflected light.

15. An optical device comprising:
a point light source configured to generate an input light;
a first lens configured to collimate the input light such that the input light becomes parallel light;
an illumination pupil shape controller configured to modify the input light that has passed through the first lens;
a beam splitter configured to reflect the input light having passed through the illumination pupil shape controller toward a sample, and transmit a light reflected by the sample;
an objective lens arranged on an optical path of the input light after the beam splitter, the objective lens configured to focus the input light on the sample, and to collimate the reflected light from the sample such that the reflected light becomes parallel light;
a second lens configured to focus the reflected light having passed through the objective lens;
a noise filter including a first noise filter plate that includes a pinhole arranged on a focus of the second lens for the reflected light; and
an image sensor configured to detect the reflected light that has passed through the noise filter,
wherein the noise filter configured to remove a part of the reflected light, wherein the part of the reflected light is generated by underlying layers below a measurement target layer of the sample,
wherein the noise filter further includes a second noise filter plate including a first light-shielding part of a circular shape, a first ring-shaped light-transmitting part surrounding the first light-shielding part, and a second light-shielding part surrounding the first ring-shaped light-transmitting part, wherein the noise filter further includes a third noise filter plate including a third light-shielding part of a circular shape, a second ring-shaped light-transmitting part surrounding the second light-shielding part, and a fourth light-shielding part surrounding the second ring-shaped light-transmitting part, and wherein the second noise filter plate and the third noise filter plate are spaced apart with the first noise filter plate therebetween.

16. An optical device comprising:

a point light source configured to generate an input light;

a first lens configured to collimate the input light such that the input light becomes parallel light;

an illumination pupil shape controller configured to modify the input light that has passed through the first lens;

a first objective lens configured to focus the input light that has passed through the illumination pupil shape controller toward a sample, the input light being incident obliquely on the sample;

a second objective lens configured to collimate a reflected light such that the reflected light becomes parallel light, the reflected light being reflected obliquely with respect to the sample;

a second lens configured to focus the reflected light that has passed through the second objective lens;

a noise filter including a first noise filter plate that includes a pinhole arranged on a focus of the second lens for the reflected light; and an image sensor configured to detect the reflected light that has passed through the noise filter, wherein the noise filter is configured to remove a part of the reflected light, the part of the reflected light being generated by underlying layers below a measurement target layer of the sample, wherein the noise filter further comprises a second noise filter plate including a first light-shielding part of a circular shape, a first ring-shaped light-transmitting part surrounding the first light-shielding part, and a second light-shielding part surrounding the first ring-shaped light-transmitting part, wherein the noise filter further comprises a third noise filter plate including a third light-shielding part of a circular shape, a second ring-shaped light-transmitting part surrounding the second light-shielding part, and a fourth light-shielding part surrounding the second ring-shaped light-transmitting part, and wherein the second noise filter plate and the third noise filter plate are spaced apart with the first noise filter plate therebetween.

\* \* \* \* \*